United States Patent

Hayashi et al.

(10) Patent No.: US 9,472,352 B2
(45) Date of Patent: Oct. 18, 2016

(54) PHOTOELECTRIC CONVERSION ELEMENT

(71) Applicant: Panasonic Corporation, Osaka (JP)

(72) Inventors: Naoki Hayashi, Osaka (JP); Michio Suzuka, Osaka (JP); Hiroki Yabe, Osaka (JP); Takashi Sekiguchi, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 14/682,107

(22) Filed: Apr. 9, 2015

(65) Prior Publication Data
US 2015/0310999 A1 Oct. 29, 2015

(30) Foreign Application Priority Data

Apr. 28, 2014 (JP) .................. 2014-092716

(51) Int. Cl.
*H01G 9/20* (2006.01)

(52) U.S. Cl.
CPC .................. *H01G 9/2059* (2013.01)

(58) Field of Classification Search
CPC . H01G 9/2059; H01G 9/2063; Y02E 10/542
See application file for complete search history.

(56) References Cited

U.S. PATENT DOCUMENTS

2011/0155241 A1* 6/2011 Takata .................. C07D 209/20 136/256
2013/0008510 A1 1/2013 Nakamura et al.

FOREIGN PATENT DOCUMENTS

| IT | WO 2013030737 A1 * | 3/2013 | ......... C09B 23/0075 |
| JP | 2008091137 A * | 4/2008 | ........... H01G 9/2031 |

(Continued)

OTHER PUBLICATIONS

Zhang et al., "The 2,2,2,6-Tetramethyl-1-piperidinyloxy Radical: An Efficient Iodine-Free Redox Mediator for Dye-Sensitized Solar Cells"., 2008, Advanced Functional Materials, 18, pp. 341-346.*

(Continued)

*Primary Examiner* — Devina Pillay
*Assistant Examiner* — Daniel Malley, Jr.
(74) *Attorney, Agent, or Firm* — Renner, Otto, Boisselle & Sklar, LLP

(57) ABSTRACT

A photoelectric conversion element includes a photoanode including a semiconductor layer and dye molecules located on the semiconductor layer; a counter electrode facing the photoanode; and an electrolyte medium located between the photoanode and the counter electrode, wherein each of the dye molecules is represented by a general formula [I] below where $R_1$ and $R_2$ each independently represent an alkyl group having 8 or more carbon atoms; $R_9$ represents an alkylene group or an aralkylene group; and $Y_2$ represents an acidic group.

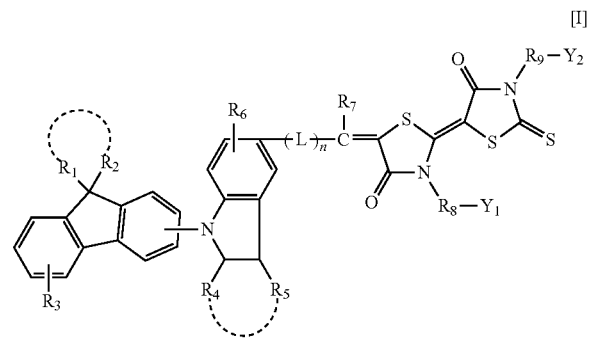

7 Claims, 1 Drawing Sheet

(56) References Cited

FOREIGN PATENT DOCUMENTS

| JP | 2008-204785 | 9/2008 | |
| JP | WO 2011096508 A1 * | 8/2011 | ........... H01G 9/2031 |
| JP | 2013-035936 | 2/2013 | |
| JP | 2014-005425 A * | 1/2014 | ............. C09B 23/00 |
| WO | 2011/118197 | 9/2011 | |

OTHER PUBLICATIONS

English Translation for JP 2014-005425 provided by the Japanese Patent Office.*

* cited by examiner

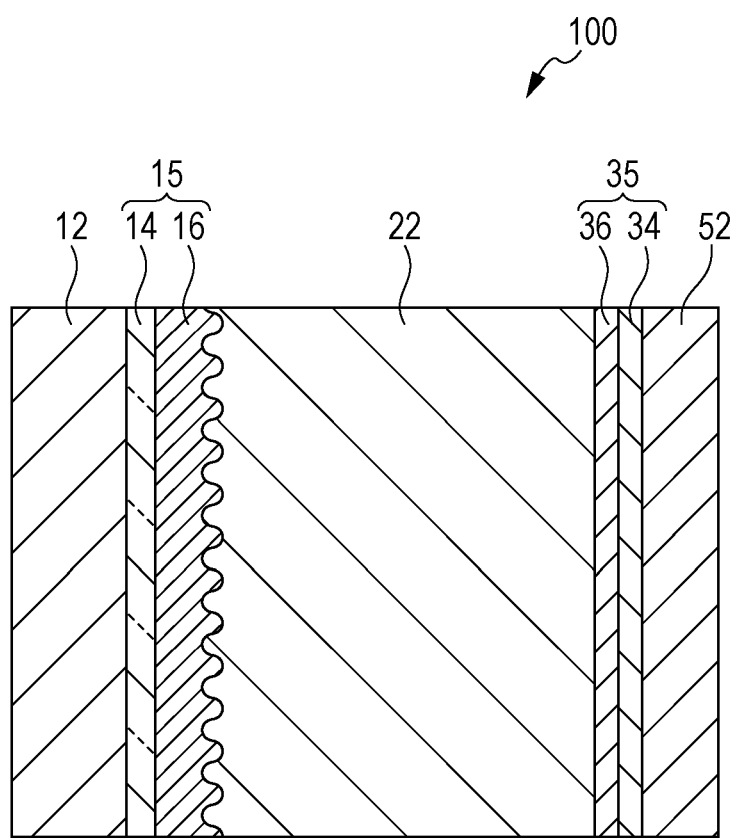

PHOTOELECTRIC CONVERSION ELEMENT

BACKGROUND

1. Technical Field

The present disclosure relates to a photosensitized photoelectric conversion element. The term "photosensitized photoelectric conversion element" encompasses what is called dye-sensitized solar cells and also encompasses photoelectrochemical power generation elements that can generate power even in environments having a relatively low illuminance, such as indoors.

2. Description of the Related Art

In recent years, dye-sensitized solar cells employing dyes as photosensitizers have been developed. A typical dye-sensitized solar cell includes a photoanode containing a dye, a counter electrode, and an electrolyte medium disposed between the photoanode and the counter electrode. The electrolyte medium is, for example, an electrolyte solution containing an oxidation-reduction substance. The oxidation-reduction substance is called mediator.

Enhancement of characteristics of dye-sensitized solar cells requires enhancement of characteristics of components of the solar cells. For example, Japanese Unexamined Patent Application Publication No. 2008-204785 states that use of a dye molecule having a fluorene residue having a specific rigid planar structure can increase photoelectric conversion efficiency (hereafter simply referred to as "conversion efficiency"). International Publication No. 2011/118197 states that use of, as mediators, radical compounds having an average molecular weight of 200 or more and including 4-acetamide-2,2,6,6-tetramethylpiperidine-1-oxyl can increase conversion efficiency.

SUMMARY

However, even the configurations of Japanese Unexamined Patent Application Publication No. 2008-204785 and International Publication No. 2011/118197 do not provide a sufficiently high conversion efficiency. In particular, there has been a demand for a photoelectric conversion element that exhibits a high conversion efficiency even in environments having a relatively low illuminance, such as indoors.

One non-limiting and exemplary embodiment provides a photoelectric conversion element that exhibits a high conversion efficiency.

In one general aspect, the techniques disclosed here feature a photoelectric conversion element including a photoanode including a semiconductor layer and dye molecules located on the semiconductor layer; a counter electrode facing the photoanode; and an electrolyte medium located between the photoanode and the counter electrode, wherein each of the dye molecules is represented by a general formula [I] below

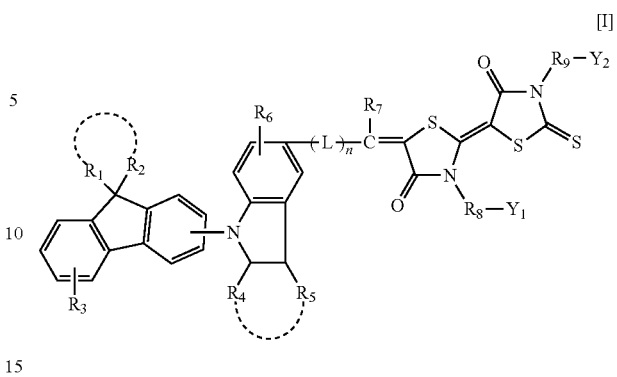

where $R_1$ and $R_2$ each independently represent an alkyl group having 8 or more carbon atoms; $R_3$ represents a substituent in the aromatic ring, the substituent being a hydrogen atom, a halogen atom, an alkyl group, an aralkyl group, an aryl group, or a heterocyclic substituent; $R_4$ and $R_5$ each independently represent an alkyl group, an aralkyl group, an aryl group, or a heterocyclic substituent; $R_6$ represents a substituent in the aromatic ring, the substituent being a hydrogen atom, an alkyl group, an alkoxy group, an aryl group, or a halogen atom; L represents a divalent bonding group; n represents 0 or 1; $R_7$ represents a hydrogen atom, an alkyl group, an aralkyl group, an aryl group, or a heterocyclic substituent; $R_8$ represents an alkylene group, an aralkylene group, or an arylene group; $R_9$ represents an alkylene group or an aralkylene group; and $Y_1$ and $Y_2$ each independently represent an acidic group.

One non-limiting and exemplary embodiment can provide a photoelectric conversion element that exhibits a high conversion efficiency.

It should be noted that general or specific embodiments may be implemented as a device, a system, a method, or any selective combination thereof.

Additional benefits and advantages of the disclosed embodiments will become apparent from the specification and drawing. The benefits and/or advantages may be individually obtained by the various embodiments and features of the specification and drawing, which need not all be provided in order to obtain one or more of such benefits and/or advantages.

BRIEF DESCRIPTION OF THE DRAWING

FIGURE is a schematic view illustrating the structure of a photoelectric conversion element according to an embodiment of the present disclosure.

DETAILED DESCRIPTION

The present disclosure encompasses photoelectric conversion elements and dye molecules contained in photoelectric conversion elements described in the following Items.

Item 1

A photoelectric conversion element includes a photoanode including a semiconductor layer and dye molecules located on the semiconductor layer; a counter electrode facing the photoanode; and an electrolyte medium located between the photoanode and the counter electrode, wherein each of the dye molecules is represented by a general formula [I] below

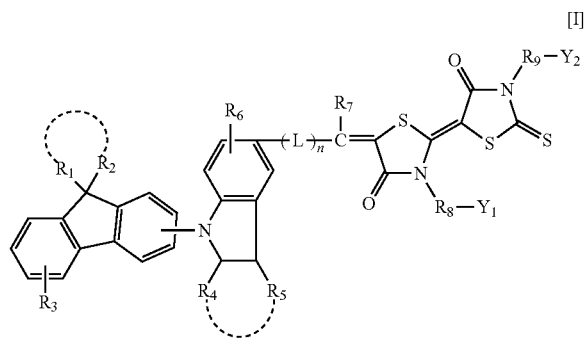

where $R_1$ and $R_2$ each independently represent an alkyl group having 8 or more carbon atoms; $R_3$ represents a substituent in the aromatic ring, the substituent being a hydrogen atom, a halogen atom, an alkyl group, an aralkyl group, an aryl group, or a heterocyclic substituent; $R_4$ and $R_5$ each independently represent an alkyl group, an aralkyl group, an aryl group, or a heterocyclic substituent; $R_6$ represents a substituent in the aromatic ring, the substituent being a hydrogen atom, an alkyl group, an alkoxy group, an aryl group, or a halogen atom; L represents a divalent bonding group; n represents 0 or 1; $R_7$ represents a hydrogen atom, an alkyl group, an aralkyl group, an aryl group, or a heterocyclic substituent; $R_8$ represents an alkylene group, an aralkylene group, or an arylene group; $R_9$ represents an alkylene group or an aralkylene group; and $Y_1$ and $Y_2$ each independently represent an acidic group.

Item 2

The photoelectric conversion element according to Item 1, wherein, in the general formula [I], $R_1$ and $R_2$ each independently represent an alkyl group having 18 or more and 26 or less carbon atoms.

Item 3

The photoelectric conversion element according to Item 2, wherein, in the general formula [I], $R_1$ and $R_2$ each independently represent an alkyl group having 20 or more and 22 or less carbon atoms.

Item 4

The photoelectric conversion element according to any one of Items 1 to 3, wherein the semiconductor layer has a thickness of not more than 1.0 μm.

Item 5

The photoelectric conversion element according to any one of Items 1 to 4, wherein the electrolyte medium contains a compound having a nitroxyl radical represented by a chemical formula [II] below.

Item 6

The photoelectric conversion element according to Item 5, wherein the compound has a molecular weight of less than 200.

Item 7

The photoelectric conversion element according to Item 5 or 6, wherein the compound has an oxidation-reduction potential of 0.65 V measured against Ag/Ag+.

Item 8

The photoelectric conversion element according to any one of Items 5 to 7, wherein the compound is 2,2,6,6-tetramethylpiperidine-1-oxyl.

Item 9

A dye molecule located on a semiconductor layer of a photoanode of a photoelectric conversion element, the photoelectric conversion element including the photoanode including the semiconductor layer, a counter electrode facing the photoanode, and an electrolyte medium located between the photoanode and the counter electrode, wherein the dye molecule is represented by a general formula [I] below

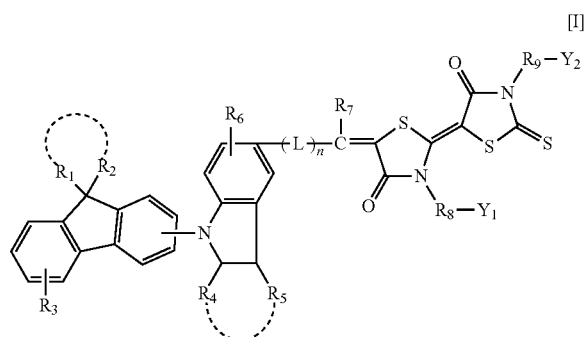

where $R_1$ and $R_2$ each independently represent an alkyl group having 8 or more carbon atoms, $R_1$ and $R_2$ may be linked to form a ring structure; $R_3$ represents a substituent in the aromatic ring, the substituent being a hydrogen atom, a halogen atom, an alkyl group, an aralkyl group, an aryl group, or a heterocyclic substituent; $R_4$ and $R_5$ each independently represent an alkyl group, an aralkyl group, an aryl group, or a heterocyclic substituent, $R_4$ and $R_5$ may be linked to form a ring structure; $R_6$ represents a substituent in the aromatic ring, the substituent being a hydrogen atom, an alkyl group, an alkoxy group, an aryl group, or a halogen atom; L represents a divalent bonding group; n represents 0 or 1; $R_7$ represents a hydrogen atom, an alkyl group, an aralkyl group, an aryl group, or a heterocyclic substituent; $R_8$ represents an alkylene group, an aralkylene group, or an arylene group; $R_9$ represents an alkylene group or an aralkylene group; and $Y_1$ and $Y_2$ each independently represent an acidic group.

EMBODIMENTS

Hereinafter, embodiments according to the present disclosure will be described with reference to the drawing.

FIGURE is a schematic view illustrating the structure of a photoelectric conversion element 100 according to an embodiment of the present disclosure. The photoelectric conversion element 100 includes a photoanode 15, a counter electrode 35, and an electrolyte medium 22 disposed between the photoanode 15 and the counter electrode 35. The electrolyte medium 22 is typically an electrolyte solution and will be sometimes referred to as an electrolyte solution 22 below. Alternatively, the electrolyte medium 22 may be, for example, an electrolyte gel or a solid polymer electrolyte.

The photoanode 15 is supported on a substrate 12. The photoanode 15 includes, for example, a conductive layer 14 that transmits visible light (sometimes referred to as a transparent conductive layer) and a solid semiconductor layer 16 formed on the conductive layer 14. The solid semiconductor layer 16 contains dye molecules serving as a photosensitizer. The solid semiconductor layer 16 is, for example, a porous semiconductor layer formed of porous titanium oxide. The solid semiconductor layer 16 is sometimes simply referred to as a semiconductor layer 16.

The counter electrode 35 is disposed so as to face the semiconductor layer 16 with the electrolyte medium 22 therebetween. The counter electrode 35 is supported on a substrate 52. The counter electrode 35 includes, for example, a conductive oxide layer 34 and a metal layer (for example, a platinum layer) 36 formed on the conductive oxide layer 34.

The electrolyte medium 22 is, for example, an electrolyte solution containing a mediator. The space between the photoanode 15 and the counter electrode 35 is sealed with a sealing part (not shown) such that the electrolyte medium 22 is confined within the space.

In the photoelectric conversion element 100 according to an embodiment of the present disclosure, the dye molecules contained in the solid semiconductor layer 16 are each represented by a general formula [I] below.

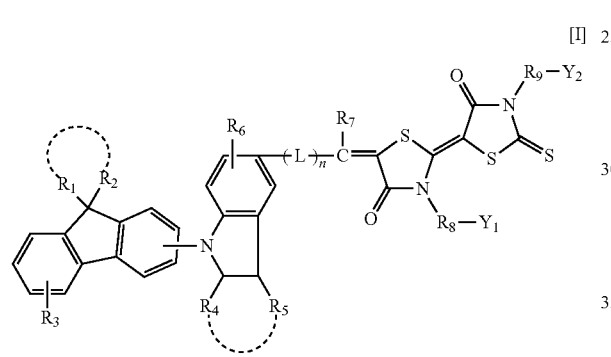

In the general formula [I], $R_1$ and $R_2$ each independently represent an alkyl group having 8 or more carbon atoms, $R_1$ and $R_2$ may be linked to form a ring structure; $R_3$ represents a substituent in the aromatic ring, the substituent being a hydrogen atom, a halogen atom, an alkyl group, an aralkyl group, an aryl group, or a heterocyclic substituent; $R_4$ and $R_5$ each independently represent an alkyl group, an aralkyl group, an aryl group, or a heterocyclic substituent, $R_4$ and $R_5$ may be linked to form a ring structure; $R_6$ represents a substituent in the aromatic ring, the substituent being a hydrogen atom, an alkyl group, an alkoxy group, an aryl group, or a halogen atom; L represents a divalent bonding group; n represents 0 or 1; $R_7$ represents a hydrogen atom, an alkyl group, an aralkyl group, an aryl group, or a heterocyclic substituent; $R_8$ represents an alkylene group, an aralkylene group, or an arylene group; $R_9$ represents an alkylene group or an aralkylene group; and $Y_1$ and $Y_2$ each independently represent an acidic group.

Dye molecules represented by the general formula [I] can be synthesized by, for example, a method described in Seigo Ito et al., Chem. Commun., 2008, 5194-5196.

For example, as described by the following reaction formula, a reaction of a compound (1) and a compound (2) can provide a dye molecule (D-3) represented by the general formula [I]. Specifically, the compound (1) and the compound (2) are stirred in a solvent mixture of acetic acid and ammonium acetate at 120° C. for 5 hours. After the reaction is completed, the reaction solution is cooled and the resultant precipitate is obtained by filtration and washed with methanol. The precipitate is subjected to silica gel column purification. Thus, the dye molecules (D-3) are extracted as a reddish purple powder.

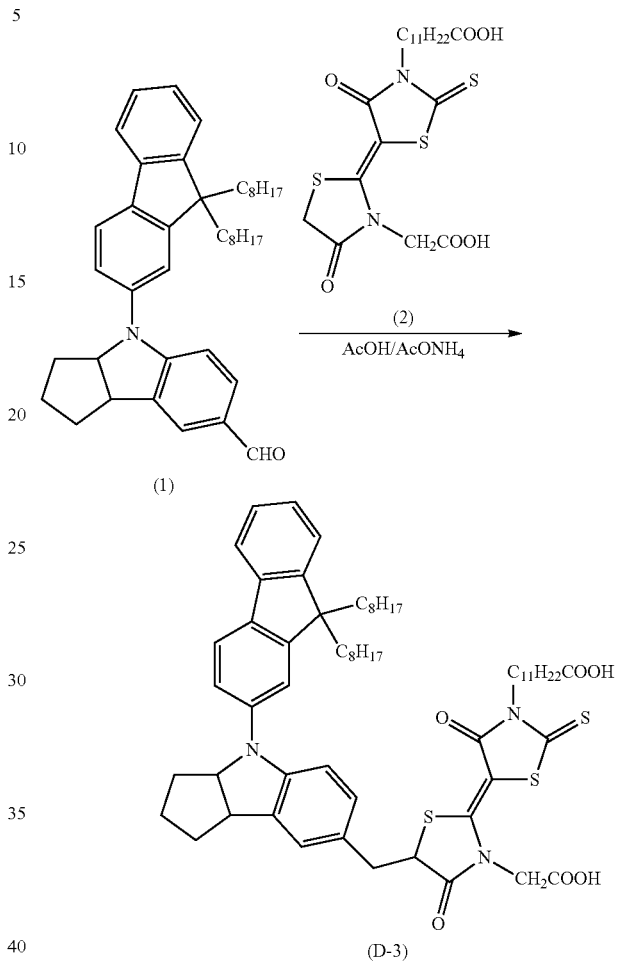

As will be described with reference to experimental examples below, use of dye molecules represented by the general formula [I] can provide photoelectric conversion elements that exhibit a high conversion efficiency, in particular, in environments having a relatively low illuminance of about 200 lx. This is achieved by a mechanism described below. However, the following description does not limit the present disclosure.

In dye molecules represented by the general formula [I], $R_1$ and $R_2$ each independently represent an alkyl group having 8 or more carbon atoms. These alkyl groups $R_1$ and $R_2$ cause steric hindrance between dye molecules. During adsorption of dye molecules onto the semiconductor layer, this steric hindrance caused by long-chain alkyl groups results in a decrease in the ratio of dye molecules that are adsorbed onto the semiconductor layer so as not to contribute highly to photoelectric conversion. In other words, the steric hindrance causes an increase in the ratio of dye molecules that are adsorbed onto the semiconductor layer so as to contribute efficiently to photoelectric conversion. The validity of this mechanism is supported by experimental results: as the number of carbon atoms of the alkyl groups $R_1$ and $R_2$ increases, the absorbance of dye molecules adsorbing on the semiconductor layer decreases, whereas the current increases. An example of such experimental results is described below.

Regarding photoelectric conversion elements of Examples 1 and 15 and Comparative example 1 described below, the following Table 1 describes measurement results of the absorbance and short-circuit current density of the semiconductor layer loaded with dye molecules. The number of carbon atoms of each of the alkyl groups $R_1$ and $R_2$ in the general formula [I] is 8 in Example 1, 22 in Example 15, and 4 in Comparative example 1.

TABLE 1

| Number of carbon atoms | Absorbance (—) | $J_{sc}$ ($\mu A/cm^2$) |
|---|---|---|
| 4 | 1.7 | 9.4 |
| 8 | 1.4 | 14.8 |
| 22 | 1.2 | 21.2 |

As will be understood from experimental examples below, $R_1$ and $R_2$ in the general formula [I] may each independently represent an alkyl group having 18 or more and 26 or less carbon atoms, or an alkyl group having 20 or more and 22 or less carbon atoms.

The photoelectric conversion element 100 according to an embodiment of the present disclosure can have an advantage of achieving a high open circuit voltage. Use of the above-described dye molecules can provide a high photoelectric conversion efficiency. Accordingly, even when the semiconductor layer has a small thickness, it can be loaded with dye molecules in an amount sufficient for light absorption. As is well known, the electron density of a semiconductor layer can be determined by the following equation.

Electron density ($C/cm^3$)=Amount of charges in semiconductor layer/Volume of semiconductor layer As is obvious from this equation, as the thickness of the semiconductor layer decreases, the electron density in the semiconductor layer increases. It is also known that the open circuit voltage of a photoelectric conversion element is proportional to the electron density of the semiconductor layer. Accordingly, use of the above-described dye molecules allows reduction of the thickness of the semiconductor layer, which results in a high open circuit voltage. In the photoelectric conversion element 100 according to an embodiment of the present disclosure, the solid semiconductor layer 16 has a thickness of, for example, not more than 1.0 μm.

The mediator also influences the conversion efficiency of the photoelectric conversion element 100. In order to achieve high-efficient charge separation, an appropriate potential difference may be provided at a charge separation interface between the dye molecule and the mediator. This is achieved by use of a mediator, for example, a compound having a nitroxyl radical. The mediator may have an oxidation-reduction potential of 0.65 V measured against $Ag/Ag^+$. The mediator may be, for example, 2,2,6,6-tetramethylpiperidine-1-oxyl (hereafter also referred to as "TEMPO").

The mediator is desirably dispersed sufficiently within the semiconductor layer 16. In order to achieve such sufficient dispersion, the mediator may have a relatively low molecular weight. The compound having a nitroxyl radical may have a molecular weight of less than 200.

Hereinafter, materials used for forming the above-described components of the photoelectric conversion element 100 will be described in detail.

Dye Molecules

The dye molecules represented by the general formula [I] will be described in detail.

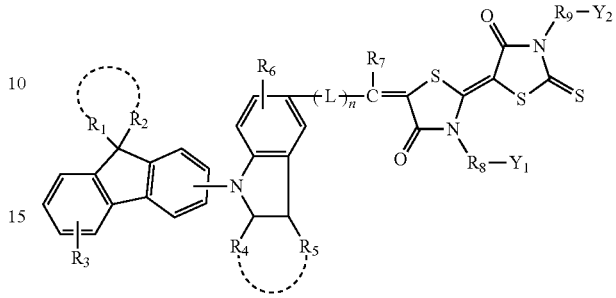

In the general formula [I], $R_1$ and $R_2$ each independently represent an alkyl group having 8 or more carbon atoms, $R_1$ and $R_2$ may be linked to form a ring structure; $R_3$ represents a substituent in the aromatic ring, the substituent being a hydrogen atom, a halogen atom, an alkyl group, an aralkyl group, an aryl group, or a heterocyclic substituent; $R_4$ and $R_5$ each independently represent an alkyl group, an aralkyl group, an aryl group, or a heterocyclic substituent, $R_4$ and $R_5$ may be linked to form a ring structure; $R_6$ represents a substituent in the aromatic ring, the substituent being a hydrogen atom, an alkyl group, an alkoxy group, an aryl group, or a halogen atom; L represents a divalent bonding group; n represents 0 or 1; $R_7$ represents a hydrogen atom, an alkyl group, an aralkyl group, an aryl group, or a heterocyclic substituent; $R_8$ represents an alkylene group, an aralkylene group, or an arylene group; $R_9$ represents an alkylene group or an aralkylene group; and $Y_1$ and $Y_2$ each independently represent an acidic group.

Specific examples of $R_1$ and $R_2$ include long-chain alkyl groups such as an octyl group. $R_1$ and $R_2$ may be linked to represent a residue having a ring structure.

$R_3$ represents a substituent in the aromatic ring. Examples of this substituent include a hydrogen atom; halogen atoms such as a chlorine atom and a bromine atom; alkyl groups such as a methyl group, an ethyl group, and a n-butyl group; aralkyl groups such as a benzyl group and a phenethyl group; aryl groups such as a phenyl group and a 1-naphthyl group; and heterocyclic substituents such as a furyl group, a thienyl group, and an indolyl group.

Specific examples of $R_4$ and $R_5$ include alkyl groups such as a methyl group, an ethyl group, and a cyclohexyl group; aralkyl groups such as a benzyl group and a phenethyl group; aryl groups such as a phenyl group, a biphenyl group, and a 1-naphthyl group; and heterocyclic substituents such as a furyl group, a thienyl group, and an indolyl group. $R_4$ and $R_5$ may be linked to represent a residue having a ring structure. $R_4$ and $R_5$ may be linked and represent an alkylene residue that provides a cyclopentane ring or a cyclohexane ring. $R_4$ and $R_5$ may be linked and represent an alkylene residue that provides a cyclopentane ring.

$R_6$ represents a substituent in the aromatic ring. Examples of this substituent include a hydrogen atom; alkyl groups such as a methyl group, an ethyl group, and a cyclohexyl group; alkoxy groups such as a methoxy group and an ethoxy group; aryl groups such as a phenyl group, a biphenyl group, and a 1-naphthyl group; and halogen atoms. These substituents themselves may have substituents. Specific examples of such substituents include alkylthio groups, aryloxy groups, arylthio groups, halogen atoms, disubstituted amino groups, aryl groups, and heterocycles.

Specific examples of L include divalent bonding groups represented by the following chemical formula. These divalent bonding groups themselves may have substituents. L is not limited to these divalent bonding groups.

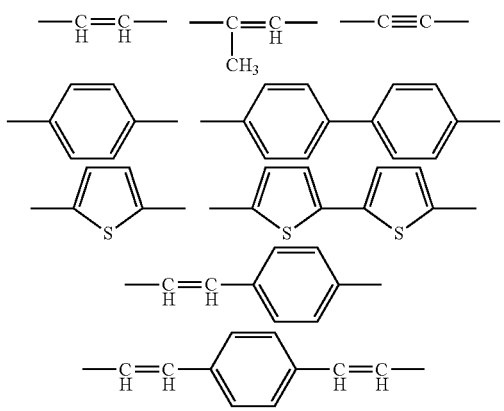

Specific examples of $R_7$ include a hydrogen atom; alkyl groups such as a methyl group, an ethyl group, and a cyclohexyl group; aralkyl groups such as a benzyl group and a phenethyl group; aryl groups such as a phenyl group, a biphenyl group, and a 1-naphthyl group; and a heterocyclic substituent such as a furyl group, a thienyl group, and an indolyl group.

Specific examples of $R_8$ include alkylene groups such as a methylene group, an ethylene group, a propylene group, and a n-butylene group; aralkylene groups such as a benzylene group and a phenethylene group; and arylene groups such as a phenylene group and a 2-naphthylene group.

Specific examples of $Y_1$ include a carboxyl group, a sulfo group, a sulfino group, a sulfeno group, a phosphono group, and a phosphinico group. Of these, a carboxyl group is particularly desirable.

Specific examples of $R_9$ include alkylene groups such as a methylene group, an ethylene group, a propylene group, and a n-butylene group; and aralkylene groups such as a benzylene group and a phenethylene group.

Specific examples of $Y_2$ include a carboxyl group, a sulfo group, a sulfino group, a sulfeno group, a phosphono group, and a phosphinico group. Of these, a carboxyl group is particularly desirable.

Non-limiting specific examples of dye molecules represented by the general formula [I] are as follows.

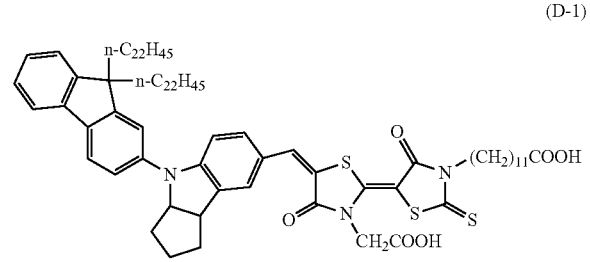

(D-1)

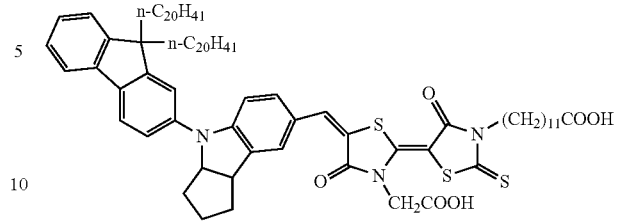

(D-2)

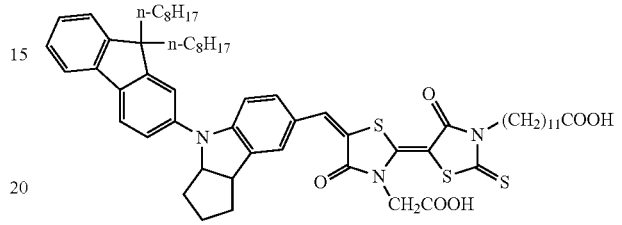

(D-3)

Dye molecules can be loaded on a semiconductor by a method appropriately selected from various known methods. For example, a substrate having a semiconductor layer (for example, a porous semiconductor not containing any dye molecules) is immersed in a solution in which dye molecules are dissolved or dispersed. The medium of this solution may be appropriately selected from media that can dissolve dye molecules therein, such as water, alcohol, toluene, and dimethylformamide. During immersion of the substrate in the solution containing dye molecules, the solution may be heated or ultrasonic waves may be applied to the solution. After being immersed, the substrate may be washed with a solvent (such as alcohol) and/or heated to thereby remove excess dye molecules.

The amount of dye molecules loaded in the semiconductor layer is, for example, within the range of $1 \times 10^{-10}$ to $1 \times 10^{-4}$ mol/cm². From the standpoint of photoelectric conversion efficiency and cost, this amount may be within the range of $0.1 \times 10^{-8}$ to $9.0 \times 10^{-6}$ mol/cm².

Photoanode

The photoanode 15 functions as the negative electrode of the photoelectric conversion element 100. As described above, the photoanode 15 includes, for example, the conductive layer 14 that transmits visible light and the semiconductor layer 16 formed on the conductive layer 14. The semiconductor layer 16 contains dye molecules. The semiconductor layer 16 containing dye molecules is sometimes referred to as a light-absorbing layer. The substrate 12 is, for example, a glass substrate or a plastic substrate (the term "plastic substrate" encompasses a plastic film) that transmits visible light.

The conductive layer 14 that transmits visible light can be formed of, for example, a material that transmits visible light (hereafter referred to as "transparent conductive material"). Examples of the transparent conductive material include zinc oxide, indium-tin double oxide, a multilayer structure including an indium-tin double oxide layer and a silver layer, tin oxide doped with antimony, and tin oxide doped with fluorine. Of these, tin oxide doped with fluorine is desirable because it has a very high conductivity and a very high light transmittance. The higher the light transmittance of the conductive layer 14 is, the more desirable it is. The light transmittance of the conductive layer 14 may be 50% or more, or 80% or more.

The conductive layer 14 may have a thickness, for example, in the range of 0.1 to 10 μm. In a case where the conductive layer 14 is formed so as to satisfy this range, the conductive layer 14 having a uniform thickness can be formed and the light transmittance of the conductive layer 14 does not decrease, so that light can sufficiently enter the semiconductor layer 16. The lower the surface resistance of the conductive layer 14 is, the more desirable it is. The surface resistance of the conductive layer 14 may be 200 Ω/square or less, or may be 50 Ω/square or less. The lower limit of the surface resistance is not particularly defined, but it is, for example, 0.1 Ω/square. The conductive layers of photoelectric conversion elements used under sunlight often have a sheet resistance of about 10 Ω/square. In contrast, in the photoelectric conversion element 100 used under, for example, a fluorescent lamp emitting light having a lower illuminance than sunlight, the amount of photoelectrons is small (low photoelectric current) and hence resistance components contained in the conductive layer 14 tend not to cause adverse effects. For this reason, in the photoelectric conversion element 100 used in a low-illuminance environment, the conductive layer 14 may have a surface resistance in the range of 30 to 200 Ω/square from the standpoint of cost reduction achieved by reducing the amount of conductive material in the conductive layer 14.

Alternatively, the conductive layer 14 that transmits visible light may be formed of a conductive material that does not pass light therethrough. For example, the conductive layer 14 may be a metal layer having a pattern made up of straight lines (stripe pattern) or wavy lines, a grid pattern (mesh pattern), or a perforated-metal pattern (pattern in which a large number of fine through-holes are arranged at regular or irregular intervals); or a metal layer having a pattern inverse to such a pattern. In such a metal layer, light can pass through apertures formed in the metal layer. Examples of a metal usable for forming the metal layer include platinum, gold, silver, copper, aluminum, rhodium, indium, titanium, iron, nickel, tin, zinc, and alloys containing one or more of the foregoing. Alternatively, instead of metal, a conductive carbon material may be used to form the conductive layer 14.

The conductive layer 14 that transmits visible light may have a transmittance of, for example, 50% or more, or 80% or more. The wavelength of light that the conductive layer 14 transmits is set in accordance with the absorption wavelength of the dye molecules used.

In a case where the semiconductor layer 16 receives light on a side of the photoelectric conversion element 100, the side being opposite to the substrate 12, it is not necessary that the substrate 12 and the conductive layer 14 transmit visible light. Thus, in a case where this conductive layer 14 is formed of metal or carbon as described above, formation of apertures in the metal or carbon layer is not necessary. In a case where such a material of the conductive layer 14 has a sufficiently high strength, the conductive layer 14 can be formed so as to also function as the substrate 12.

In order to suppress electron leakage occurring in the surface of the conductive layer 14, that is, in order to provide a rectifying effect between the conductive layer 14 and the semiconductor layer 16, an oxide layer formed of, for example, silicon oxide, tin oxide, titanium oxide, zirconium oxide, or aluminum oxide may be formed between the conductive layer 14 and the semiconductor layer 16.

As described above, the semiconductor layer 16 containing dye molecules includes, for example, a porous semiconductor material and dye molecules loaded on the surface of the porous semiconductor material. The porous semiconductor material is, for example, porous titanium oxide ($TiO_2$). Titanium oxide is advantageous in that it has excellent photoelectric conversion characteristics and it tends not to undergo photodissolution into electrolyte solutions. The term "photodissolution" denotes a phenomenon in which a substance exposed to light energy is itself chemically changed and then dissolved in a solution. A porous material is advantageous in that it has a large specific surface area and can be loaded with a large number of dye molecules. Alternatively, instead of porous material, the semiconductor layer 16 may be formed of, for example, aggregated semiconductor particles.

Compared with a semiconductor layer 16 having a structure of a monolayer that is uniform in the thickness direction, it is desirable to have a semiconductor layer 16 having a structure (for example, a multilayer structure) in which a light-receiving region exhibits a low degree of light scattering, which increases as light passes through the semiconductor layer 16. This is because a high light-absorbing efficiency is achieved, which results in a photoelectric conversion element having a high conversion efficiency (for example, refer to Japanese Unexamined Patent Application Publication Nos. 2010-272530 and 2002-289274).

For example, the semiconductor layer 16 of the photoelectric conversion element 100 according to the present disclosure includes a low-light-scattering layer and a high-light-scattering layer that contain aggregated semiconductor particles. Light initially enters the low-light-scattering layer (the semiconductor particles have an average particle size of 5 to 50 nm, desirably 5 to 30 nm). Light having passed through the low-light-scattering layer enters the high-light-scattering layer (the semiconductor particles have an average particle size of 100 to 500 nm, desirably 200 to 400 nm). In such a case where semiconductor layers that exhibit different degrees of light scattering are stacked, the low-light-scattering layer may be formed so as to have a thickness corresponding to the "thickness of the semiconductor layer" of the present disclosure.

The semiconductor layer 16 may have a thickness of, for example, 0.01 μm or more and 1 μm or less. The thickness of the semiconductor layer 16 may be appropriately changed in consideration of photoelectric conversion efficiency. In cases of using dye molecules represented by the general formula [I], the semiconductor layer 16 may have a thickness of 0.5 μm or more and 0.9 μm or less. The semiconductor layer 16 desirably has a high degree of surface roughness: a surface roughness coefficient given as effective area/projected area may be 10 or more, or 100 or more. The term "effective area" denotes an effective surface area calculated from a volume determined from the projected area and thickness of the semiconductor layer and the specific surface area and bulk density of the material forming the semiconductor layer.

The semiconductor layer 16 may be formed of $TiO_2$ or another inorganic semiconductor. Examples of the inorganic semiconductor include oxides of metal elements such as Cd, Zn, In, Pb, Mo, W, Sb, Bi, Cu, Hg, Ti, Ag, Mn, Fe, V, Sn, Zr, Sr, Ga, Si, and Cr; perovskites such as $SrTiO_3$ and $CaTiO_3$; sulfides such as CdS, ZnS, $In_2S_3$, PbS, $Mo_2S$, $WS_2$, $Sb_2S_3$, $Bi_2S_3$, $ZnCdS_2$, and $Cu_2S$; metal chalcogenides such as CdSe, $In_2Se_3$, $WSe_2$, HgS, PbSe, and CdTe; and GaAs, Si, Se, $Cd_2P_3$, $Zn_2P_3$, InP, AgBr, $PbI_2$, $HgI_2$, and $BiI_3$. Of these, CdS, ZnS, $In_2S_3$, PbS, $Mo_2S$, $WS_2$, $Sb_2S_3$, $Bi_2S_3$, $ZnCdS_2$, $Cu_2S$, InP, $Cu_2O$, CuO, and CdSe are advantageous in that they can absorb light at a wavelength in the range of about 350 nm to about 1300 nm. The semiconductor layer 16 may also be formed of a composite material containing at least one selected from the above-described semiconductors. Examples of the composite material include CdS/TiO$_2$, CdS/AgI, Ag$_2$S/AgI, CdS/ZnO, CdS/HgS, CdS/PbS, ZnO/ZnS, ZnO/ZnSe, CdS/HgS, CdS$_x$/CdSe$_{1-x}$, CdS$_x$/Te$_{1-x}$, CdSe$_x$/Te$_{1-x}$, ZnS/CdSe, ZnSe/CdSe, CdS/ZnS, TiO$_2$/Cd$_3$P$_2$, CdS/CdSeCd$_y$Zn$_{1-y}$S, and CdS/HgS/CdS. The semiconductor layer 16 may also be formed of an organic semiconductor such as polyphenylenevinylene, polythiophene, polyacetylene, tetracene, pentacene, or phthalocyanine.

The semiconductor layer 16 can be formed by a method appropriately selected from various known methods. In a case of using an inorganic semiconductor, for example, a mixture of powder of the semiconductor material and an organic binder (containing an organic solvent) is disposed onto the conductive layer; and a heat treatment is subsequently carried out to remove the organic binder, so that a semiconductor layer formed of the inorganic semiconductor can be obtained. The method for disposing the mixture onto the conductive layer can be appropriately selected from various known application methods and printing methods. Examples of the application methods include a doctor blade method, a bar coating method, a spraying method, a dip coating method, and a spin-coating method. An example of the printing methods is a screen printing method. If necessary, the film of the mixture may be pressed.

In a case of using an organic semiconductor, the semiconductor layer 16 can also be formed by a method appropriately selected from various known methods. A solution of an organic semiconductor may be disposed onto the conductive layer by a method appropriately selected from various known application methods and printing methods. In a case of using, for example, a polymer semiconductor having a number-average molecular weight of 1000 or more, examples of usable methods include application methods such as a spin-coating method and a drop-casting method and printing methods such as screen printing and gravure printing. Instead of such wet processes, a dry process such as a sputtering method or a vapor deposition method may also be employed.

Counter Electrode

The counter electrode 35 functions as the positive electrode of the photoelectric conversion element 100. Examples of the material forming the counter electrode 35 include metals such as platinum, gold, silver, copper, aluminum, rhodium, and indium; carbon materials such as graphite, carbon nanotubes, and platinum on carbon; conductive metal oxides such as indium-tin double oxide, tin oxide doped with antimony, and tin oxide doped with fluorine; and conductive polymers such as polyethylenedioxythiophene, polypyrrole, and polyaniline. Of these, for example, platinum, graphite, or polyethylenedioxythiophene may be used to form the counter electrode 35.

Referring to FIGURE, the counter electrode 35 may include a transparent conductive layer 34 disposed on the substrate 52 side of the counter electrode 35. The transparent conductive layer 34 may be formed of the same material as that of the conductive layer 14 of the photoanode 15. In this case, the counter electrode 35 may be formed so as to be transparent. In such a case where the counter electrode 35 is transparent, the photoelectric conversion element 100 can receive light passing through the substrate 52 and light passing through the substrate 12. Such a configuration is effective when, for example, reflection of light occurs and the photoelectric conversion element 100 is expected to receive light on both the front surface and back surface of the photoelectric conversion element 100.

Electrolyte Medium

The electrolyte medium 22 may be an electrolyte solution prepared by dissolving an oxidation-reduction substance (mediator) in a solvent, a gel electrolyte, or a polymer electrolyte. Typically, the electrolyte medium is an electrolyte solution. The electrolyte solution may contain a mediator, a solvent, and a supporting electrolyte.

The mediator may be a compound having a nitroxyl radical. The nitroxyl radical is represented by a chemical formula [II] below. The compound exerts oxidation-reduction effects with high stability during repeated use. This compound reversibly changes between the form of a nitroxyl radical and the form of an oxoammonium cation. The compound having a nitroxyl radical and being present in an electrolyte solution functions as a mediator.

[II]

The compound having a nitroxyl radical may have a molecular weight of less than 200, in particular, 140 to 160. The compound having a nitroxyl radical may have an oxidation-reduction potential of 0.65 V measured against Ag/Ag$^+$. The concentration of the mediator may be 0.005 to 1 M, in particular, 0.01 to 0.15 M.

Examples of the supporting electrolyte include ammonium salts such as tetrabutylammonium perchlorate, tetraethylammonium hexafluorophosphate, imidazolium salts, and pyridinium salts; and alkali metal salts such as lithium perchlorate and potassium tetrafluoroborate.

The solvent may have a high ion conductivity. The solvent may be selected from aqueous solvents and organic solvents. In order to achieve higher stabilization of the solute, the solvent may be selected from organic solvents. Examples of the solvent include carbonate compounds such as dimethyl carbonate, diethyl carbonate, methyl ethyl carbonate, ethylene carbonate, and propylene carbonate; ester compounds such as methyl acetate, methyl propionate, and γ-butyrolactone; ether compounds such as diethyl ether, 1,2-dimethoxyethane, 1,3-dioxosilane, tetrahydrofuran, and 2-methyltetrahydrofuran; heterocyclic compounds such as 3-methyl-2-oxazolidinone and 2-methylpyrrolidone; nitrile compounds such as acetonitrile, methoxyacetonitrile, and propionitrile; and aprotic polar compounds such as sulfolane, dimethyl sulfoxide, and dimethylformamide. These compounds may be used alone or in combination of two or more thereof. Of these, carbonate compounds such as ethylene carbonate and propylene carbonate, heterocyclic compounds such as γ-butyrolactone, 3-methyl-2-oxazolidinone, and 2-methylpyrrolidone, and nitrile compounds such as acetonitrile, methoxyacetonitrile, propionitrile, 3-methoxypropionitrile, and valeronitrile may be used.

The solvent may be selected from ionic liquids or mixtures of ionic liquids and the above-described solvents. Ionic liquids are advantageous in that they have low volatility and high incombustibility.

The solvent may be appropriately selected from any known ionic liquids. Examples of the ionic liquids include imidazolium ionic liquids such as 1-ethyl-3-methylimidazolium tetracyanoborate, pyridine ionic liquids, alicyclic amine ionic liquids, aliphatic amine ionic liquids, azonium amine ionic liquids, and the ionic liquids described in the following documents: European Patent No. 718288; International Publication No. 95/18456; DENKI KAGAKU, vol.

65, No. 11, p. 923 (1997); J. Electrochem. Soc. vol. 143, No. 10, p. 3099 (1996); and Inorg. Chem. vol. 35, p. 1168 (1996).

EXAMPLES

Hereinafter, the present disclosure will be specifically described with reference to Examples. In Examples 1 to 15 and Comparative examples 1 to 10, photoelectric conversion elements were produced and evaluated in terms of characteristics. The evaluation results are summarized in Table 2.

Example 1

A photoelectric conversion element having substantially the same structure as the photoelectric conversion element 100 in FIGURE was produced so as to include the following components.

Substrate 12: glass substrate having thickness of 1 mm

Transparent conductive layer 14: fluorine-doped $SnO_2$ layer (surface resistance: 10 Ω/square)

Semiconductor layer 16: porous titanium oxide and dye molecules (D-3)

Electrolyte solution 22: solution containing 0.03 mol/L TEMPO and 0.1 mol/L LiTFSI (lithium bis(trifluoromethanesulfonyl)imide) in GBL (γ-butyrolactone)

Substrate 52: glass substrate having thickness of 1 mm
Conductive oxide layer 34: fluorine-doped $SnO_2$ layer (surface resistance: 10 Ω/square)

Metal layer 36: platinum layer

The photoelectric conversion element in Example 1 was produced in the following manner.

Two conductive glass substrates having a fluorine-doped $SnO_2$ layer and a thickness of 1 mm (manufactured by Asahi Glass Co., Ltd.) were prepared. These substrates were used as the substrate 12 having the transparent conductive layer 14 and the substrate 52 having the conductive oxide layer 34.

A high-purity titanium oxide powder having an average primary particle size of 20 nm was dispersed in ethylcellulose to thereby prepare paste for screen printing.

A titanium oxide layer having a thickness of about 10 nm was formed by sputtering on the fluorine-doped $SnO_2$ layer of one of the conductive glass substrates. Subsequently, the above-described paste was applied to this titanium oxide layer and dried. The resultant dried substance was fired at 500° C. for 30 minutes in the air to thereby form a porous titanium oxide layer (titanium coating) having a thickness of 1.0 μm.

Subsequently, the substrate having the porous titanium oxide layer thereon was immersed in a solvent mixture (acetonitrile:butanol=1:1) containing 0.3 mM of the dye molecules (D-3) and left at rest at room temperature for 16 hours in a dark place, so that the dye molecules were loaded on the porous titanium oxide layer. Thus, a photoanode was formed.

Platinum was deposited by sputtering on a surface of the other glass substrate to thereby form a counter electrode.

Subsequently, a hot-melt adhesive (manufactured by DU PONT-MITSUI POLYCHEMICALS CO., LTD.) serving as a sealing material was disposed on the glass substrate having the photoanode thereon, so as to surround the region of the porous titanium oxide layer of the photoanode. On this substrate having the photoanode thereon, the other glass substrate having the counter electrode was disposed. These glass substrates were heat-pressed to be bonded together. In the other glass substrate having the counter electrode, a hole was formed in advance with a diamond drill.

Subsequently, the electrolyte solution containing 0.03 mol/L TEMPO in GBL (γ-butyrolactone) was prepared. This electrolyte solution was injected through the above-described hole. Thus, the photoelectric conversion element in Example 1 was produced.

This photoelectric conversion element was irradiated with light at an illuminance of 200 lx emitted by a steady fluorescent lamp and measured in terms of current-voltage characteristics. Thus, the conversion efficiency of the photoelectric conversion element having been stabilized was determined. The illuminance in the measurement environment is about 1/500 of that of sunlight. However, use of the photoelectric conversion element is not limited to this environment and can also be used under sunlight. The result is described in Table 2.

Examples 2 to 15 and Comparative Examples 1 to 9

Photoelectric conversion elements were produced as in Example 1 except that the type of the dye molecules (the number of carbon atoms of each of $R_1$ and $R_2$ in the general formula [I]), the thickness of the titanium oxide layer, and the type of the mediator were changed as described in Table 2. The evaluation results are described in Table 2.

The following are the chemical formula and abbreviations of mediators. OH-TEMPO, NHCO-TEMPO, and CN-TEMPO each include the indication of a substituent at the 4 position of TEMPO. PTMA is the abbreviation of poly(4-methacryloyloxy-2,2,6,6-tetramethylpiperidine-N-oxyl). Plural types of PTMA having different average molecular weights were prepared.

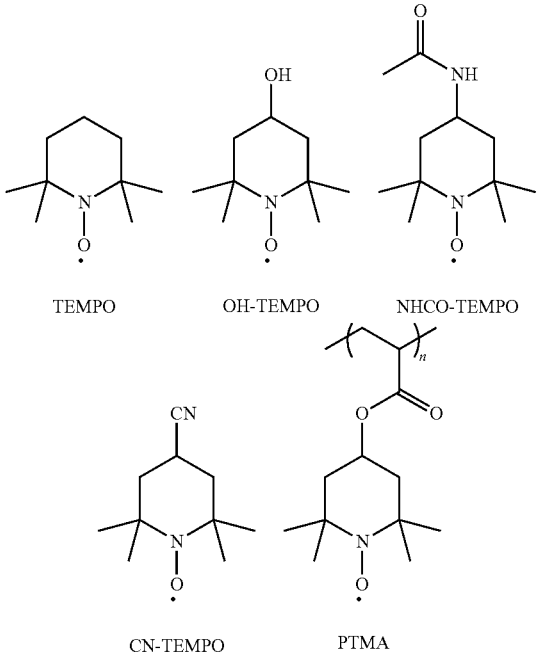

TEMPO  OH-TEMPO  NHCO-TEMPO

CN-TEMPO  PTMA

Comparative Example 10

A photoelectric conversion element was produced as in Example 1 except that the type of the dye molecules was changed to that not having the acidic group $Y_2$. Specifically, the dye molecules (D-3) represented by $(CH_2)_{11}COOH$ were changed to those represented by $(CH_2)_{10}CH_3$. The evaluation results are described in Table 2.

18 to 26 carbon atoms provide a higher conversion efficiency. In particular, Examples 14 and 15 in which $R_1$ and $R_2$ each have 20 to 22 carbon atoms provide a conversion efficiency of more than 20%.

TABLE 2

|  | Dye molecules: Number of carbon atoms of each of $R_1$ and $R_2$ | Thickness of semiconductor layer | Mediator | | | Conversion efficiency (%) at 200 lx |
|---|---|---|---|---|---|---|
|  |  |  | Type | Molecular weight | Oxidation-reduction potential measured against $Ag/Ag^+$ |  |
| Example 1 | 8 | 1.0 μm | TEMPO | 156 | 0.65 | 14.4% |
| Example 2 | 8 | 0.7 μm | TEMPO | 156 | 0.65 | 14.4% |
| Example 3 | 8 | 1.5 μm | TEMPO | 156 | 0.65 | 12.6% |
| Example 4 | 8 | 3 μm | TEMPO | 156 | 0.65 | 10.5% |
| Example 5 | 8 | 1.0 μm | LiI | 134 | 0.3 | 5.9% |
| Example 6 | 8 | 1.0 μm | Ferrocene | 186 | 0.45 | 5.6% |
| Example 7 | 8 | 1.0 μm | PTMA | 300 | 0.75 | 1.9% |
| Example 8 | 8 | 1.0 μm | PTMA | 500 | 0.75 | 1.4% |
| Example 9 | 8 | 1.0 μm | OH-TEMPO | 172 | 0.7 | 11.5% |
| Example 10 | 8 | 1.0 μm | NHCO-TEMPO | 213 | 0.75 | 7.9% |
| Example 11 | 8 | 1.0 μm | CN-TEMPO | 181 | 0.8 | 6.2% |
| Example 12 | 18 | 1.0 μm | TEMPO | 156 | 0.65 | 19.4% |
| Example 13 | 26 | 1.0 μm | TEMPO | 156 | 0.65 | 18.9% |
| Example 14 | 20 | 1.0 μm | TEMPO | 156 | 0.65 | 20.2% |
| Example 15 | 22 | 1.0 μm | TEMPO | 156 | 0.65 | 20.4% |
| Comparative example 1 | 4 | 1.0 μm | TEMPO | 156 | 0.65 | 9.6% |
| Comparative example 2 | 4 | 0.7 μm | TEMPO | 156 | 0.65 | 8.9% |
| Comparative example 3 | 4 | 3 μm | TEMPO | 156 | 0.65 | 6.9% |
| Comparative example 4 | 4 | 1.0 μm | LiI | 134 | 0.3 | 3.9% |
| Comparative example 5 | 4 | 1.0 μm | Ferrocene | 186 | 0.45 | 3.9% |
| Comparative example 6 | 4 | 1.0 μm | PTMA | 500 | 0.75 | 0.86% |
| Comparative example 7 | 4 | 1.0 μm | OH-TEMPO | 172 | 0.7 | 7.4% |
| Comparative example 8 | 4 | 1.0 μm | NHCO-TEMPO | 213 | 0.75 | 5.2% |
| Comparative example 9 | 4 | 1.0 μm | CN-TEMPO | 181 | 0.8 | 3.7% |
| Comparative example 10 | 8 | 1.0 μm | TEMPO | 156 | 0.65 | 9.2% |

The following is found as a result of comparisons between Example 1 and Comparative example 1, Example 2 and Comparative example 2, Example 4 and Comparative example 3, Example 5 and Comparative example 4, Example 6 and Comparative example 5, Example 8 and Comparative example 6, Example 9 and Comparative example 7, Example 10 and Comparative example 8, and Example 11 and Comparative example 9. Compared with Comparative examples 1 to 9 in which $R_1$ and $R_2$ each have 4 carbon atoms, Examples 1 to 11 in which $R_1$ and $R_2$ each have 8 carbon atoms provide a high conversion efficiency irrespective of other conditions such as the type of the mediator. Examples 12 to 15 in which $R_1$ and $R_2$ each have Comparison among Examples 1 to 4 indicates that the titanium oxide layer having a thickness of 1.0 μm or less can provide a high conversion efficiency.

Comparison between Example 1 and Examples 5 and 6 indicates that a photoelectric conversion element employing as the mediator a compound having a nitroxyl radical can exhibit a high conversion efficiency.

Comparison between Example 1 and Examples 7 to 11 indicates that use of, as the mediator, a compound having a nitroxyl radical and having a molecular weight of less than 200 and an oxidation-reduction potential of 0.65 V measured against $Ag/Ag^+$ can provide a high conversion efficiency.

Comparison between Example 1 and Comparative example 10 indicates that a photoelectric conversion element employing dye molecules having the acidic group $Y_2$ can exhibit a high conversion efficiency. In other words, the acidic group $Y_2$ contributes to an increase in the conversion efficiency.

A photoelectric conversion element according to an embodiment of the present disclosure can be used as a dye-sensitized power generation element that can generate power even in environments having a relatively low illuminance, such as indoors.

What is claimed is:

1. A photoelectric conversion element comprising:
   a photoanode including a semiconductor layer and dye molecules located on the semiconductor layer;
   a counter electrode facing the photoanode; and
   an electrolyte medium located between the photoanode and the counter electrode,
   wherein
   the electrolyte medium contains a compound having a nitroxyl radical represented by a chemical formula [II] below,

   [II]

the compound is 2,2,6,6-tetramethylpiperidine-1-oxyl,
each of the dye molecules is represented by a general formula [I] below

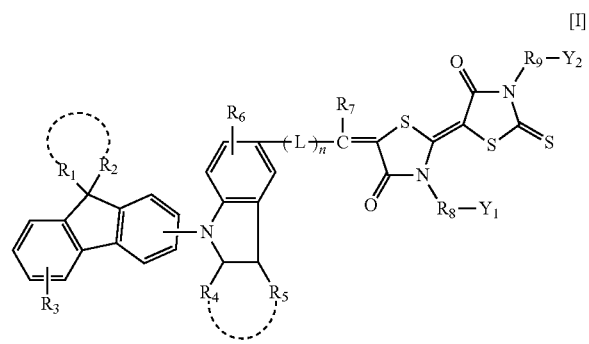   [I]

where $R_1$ and $R_2$ each independently represent an alkyl group having 18 or more and 26 or less carbon atoms, or $R_1$ and $R_2$ represent a ring structure in which an alkylene group having 18 or more and 26 or less carbon atoms is linked with an alkylene group having 18 or more and 26 or less carbon atoms;

$R_3$ represents a substituent in the aromatic ring, the substituent being a hydrogen atom, a halogen atom, an alkyl group, an aralkyl group, an aryl group, or a heterocyclic substituent;

$R_4$ and $R_5$ each independently represent an alkyl group, an aralkyl group, an aryl group, or a heterocyclic substituent, or $R_4$ and $R_5$ represent a ring structure in which an alkylene group, an aralkylene group, an arylene group, or a heterocyclic substituent is linked with an alkylene group, an aralkylene group, an arylene group, or a heterocyclic substituent;

$R_6$ represents a substituent in the aromatic ring, the substituent being a hydrogen atom, an alkyl group, an alkoxy group, an aryl group, or a halogen atom;

L represents a divalent bonding group;

n represents 0 or 1;

$R_7$ represents a hydrogen atom, an alkyl group, an aralkyl group, an aryl group, or a heterocyclic substituent;

$R_8$ represents an alkylene group, an aralkylene group, or an arylene group;

$R_9$ represents an alkylene group or an aralkylene group; and $Y_1$ and $Y_2$ each independently represent an acidic group.

2. The photoelectric conversion element according to claim 1, wherein, in the general formula [I], $R_1$ and $R_2$ each independently represent an alkyl group having 20 or more and 22 or less carbon atoms, or $R_1$ and $R_2$ represent a ring structure in which an alkylene group having 20 or more and 22 or less carbon atoms is linked with an alkylene group having 20 or more and 22 or less carbon atoms.

3. The photoelectric conversion element according to claim 1, wherein the semiconductor layer has a thickness of not more than 1.0 μm.

4. The photoelectric conversion element according to claim 1, wherein the compound has a molecular weight of less than 200.

5. The photoelectric conversion element according to claim 1, wherein the compound has an oxidation-reduction potential of 0.65 V measured against Ag/Ag$^+$.

6. The photoelectric conversion element according to claim 1, wherein $R_1$ and $R_2$ are linked to form a ring structure.

7. The photoelectric conversion element according to claim 1, wherein $R_4$ and $R_5$ are linked to form a ring structure.

* * * * *